United States Patent [19]
Westphal et al.

[11] Patent Number: 5,414,360
[45] Date of Patent: May 9, 1995

[54] GRADIENT COILS FOR THERAPY TOMOGRAPHS

[75] Inventors: Michael Westphal, Offenbach; Günther Laukien, Rheinstetten, both of Germany

[73] Assignee: Bruker Analytische Messtechnik GmbH, Germany

[21] Appl. No.: 118,005

[22] Filed: Sep. 8, 1993

[30] Foreign Application Priority Data

Sep. 9, 1992 [DE] Germany .................. 42 30 145.9

[51] Int. Cl.6 .................................................. G01V 3/00
[52] U.S. Cl. ...................................... 324/318; 324/319
[58] Field of Search ............... 324/300, 307, 309, 318, 324/319, 322

[56] References Cited

U.S. PATENT DOCUMENTS

| | | | |
|---|---|---|---|
| 5,111,147 | 5/1992 | Aubert | 324/318 |
| 5,198,796 | 3/1993 | Frese et al. | 324/318 |
| 5,307,039 | 4/1994 | Chari et al. | 324/318 |

FOREIGN PATENT DOCUMENTS

| | | | |
|---|---|---|---|
| 0009288 | 4/1980 | European Pat. Off. | G01R 33/38 |
| 0274149 | 7/1988 | European Pat. Off. | G01R 33/38 |
| 0304126 | 8/1988 | European Pat. Off. | G01N 24/06 |
| 0372096 | 11/1988 | European Pat. Off. | G01R 33/20 |
| 4029477 | 4/1991 | Germany | G01R 33/38 |
| 2229820 | 3/1990 | United Kingdom | G01R 33/42 |
| 91/19209 | 6/1991 | WIPO | G01V 3/00 |

*Primary Examiner*—Louis Arana
*Attorney, Agent, or Firm*—Walter A. Hackler

[57] ABSTRACT

A nuclear spin resonance (NMR) measuring device, in particular an NMR tomography apparatus with a preferentially superconducting main field coil which is capable of producing, within a measurement volume whose center is coincident with the origin of a Cartesian coordinate system x, y, z, a homogeneous static magnetic field $B_0$ in the direction of the z-axis of this coordinate system and with a tesseral gradient coil system for the production of magnetic gradient fields with a largely linear dependence within the measuring volume in a direction perpendicular to the z-axis, whereby the gradient coil system comprises at least four largely identical saddle-type partial coils arranged symmetrically with radial and axial separations from the coordinate origin, the partial coils each exhibiting two electrically conducting segments which run about the z-axis in the azimuthal direction one segment (21) of which has as small a radial separation $r_1$ and the other segment (22) as large a radial separation $r_2$ as possible from the z-axis, is characterised in that both azimuthal segments (21, 22) exhibit an axial separation from each other in the direction of the z-axis, whereby the radially outer segment (22) with the radial separation $r_2$ from the z-axis is, with respect to the z-axis, arranged axially closer to the coordinate origin than the radially inner segment (21) with a radial separation $r_1$ from the z-axis, and whereby both segments (21, 22) are connected to each other by means of conducting sections (23). With this configuration an unhindered sideward access to the investigational volume of the NMR measuring device is achieved with sufficient produced gradient field linearity in the measuring volume.

29 Claims, 11 Drawing Sheets

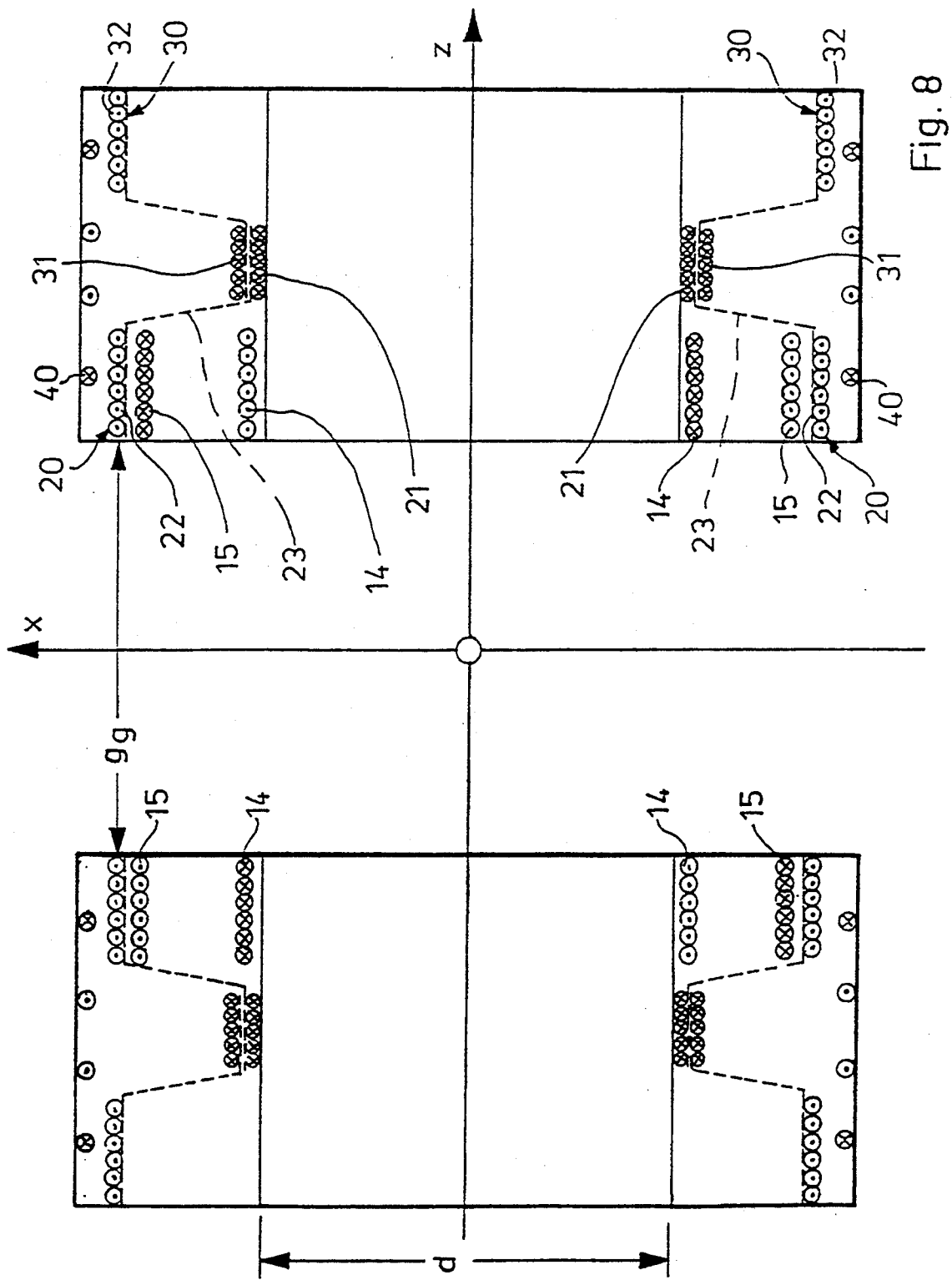

GRADIENT COILS FOR THERAPY TOMOGRAPHS

BACKGROUND OF THE INVENTION

The invention concerns a nuclear spin resonance (NMR) measuring device, in particular an NMR tomography apparatus with a preferentially superconducting main field coil which, in a measurement volume whose center coincides with the origin of a Cartesian x, y, z coordinate system, can generate a homogeneous static magnetic field $B_0$ in the direction of the z-axis of the coordinate system and with a tesseral gradient coil system for the production of magnetic gradient fields with a largely linear dependence in the measuring volume in a direction perpendicular to the z-axis, whereby the gradient coil system is comprised of at least four largely identical saddle-type partial coils which are arranged symmetrically with radial and axial separation from the origin of the coordinate system, each coil exhibiting two electrically conducting segments which run in the azimuthal direction about the z-axis of which one segment has as small a radial separation $r_1$ and the other as large a radial separation $r_2$ as possible from the z-axis.

Such an NMR measuring device is known for example from the publication DE 40 29 477 A1.

Whereas tomography systems in the past have been nearly exclusively used for diagnosis, in the future there will be an ever-growing need for combined systems with which therapeutic measures can be immediately followed and checked by tomography apparatuses. A multitude of therapeutic measures, for example, surgery in particular invasive microsurgery or irradiation thereby require as free an access to the patient as possible. This is, however, hindered in conventional NMR-systems by all three field producing components, namely the main magnetic field magnet, the gradient coil system as well as the RF-resonator.

With respect to the main field magnet the problem has already been solved with the magnet system known from DE 39 07 927 A1 exhibiting Helmholtz coil-like transverse field coil which, due to its construction, limits free sideward access to the measuring volume only in a particularly minor fashion.

In order to facilitate the carrying out of a minimum invasive method (so-called "key-hole-surgery") by which, due to the lack of a direct field of view onto the operation region in consequence of the, under certain circumstances, minuscule operating opening in the patient, an NMR monitoring provides the operator with important assistance for the on-line observation of the operation, the transverse access, with as large a sideward access angle as possible, to the measuring volume inside the NMR-apparatus should not finally be limited by the gradient coil system.

Known for example from the publication EP-A 0 073 402 is a gradient coil system in the form of simple or composite saddle coils which lie pairwise across each other on an azimuthal section about the z-axis. One such gradient coil system is located in the axial bore of the main field magnet and usually penetrates the axial region about the coordinate origin which also includes a sideward space (gap) kept open by the special construction, mentioned above, of the main field magnet and the RF-resonator. Since the known transverse gradient coils, in particular the shielding coils which are normally used in conjunction therewith, have their largest winding density precisely in the region of the central plane z=0, the advantage of transparency and the possibility of manipulations on the patient offered by the special form of the main field magnet and the RF coil system are completely lost. On the other hand the spatial arrangement of the known saddle coils which are arranged on a cylindrical surface about the z-axis under the boundary condition that no portion of the coil projects into the gap region, would lead to unacceptably large non-linearities of the produced gradient fields, to very weak gradient strengths and to large stray fields in the region of the cryostat, i.e. to the production of eddy currents when switching the gradients which, for their part, act to the detriment of the homogeneity of the static magnetic field $B_0$ in the investigational volume.

Known from the above-mentioned publication DE 40 29 477 A1 are tesseral gradient coils for NMR tomography apparatuses with which partial coils of the gradient coil system lie across from each other symmetric to the z=0 plane and to a plane perpendicular thereto, by way of example y=0, the coils each exhibiting two azimuthal segments with differing radial separations $r_1$ and $r_2$ from the z-axis each of which having the same z-position. Through this configuration the parasitic magnetic field, generated by the gradient coils, with field components perpendicular to the z-axis which induces currents in the object under investigation and in the cryostat of the main field magnet is significantly reduced. With a set of two coil types of this kind, at both sides (relative to the zy-plane) of the above-mentioned NMR measuring device investigational volume access gap, it is theoretically possible to construct a gradient coil system with the desired properties of sufficient linearity of the produced gradient fields, a relatively small stray field, and an unconstrained transverse access to the measuring volume. In order to produce the usual gradient strengths (typically at least 10 m tesla/m at a current of circa 250 A) such a coil system must exhibit approximately 30 windings with a conductor cross section of approximately 60 mm². These windings would be preferentially arranged, with respect to the z-axis, axially behind each other, whereby a sizeable axial extension of such a coil of approximately 180 mm would occur. In order to achieve the desired produced gradient field linearities, an azimuthal extent of the segments about the z-axis of at least circa 120° is necessary so that the z- and y-gradient coils would penetrate into each other, i.e. a configuration of a system with gradient coils for both spatial directions would not be realizable. On the other hand, instead of an axial distribution, a positioning of the windings radially within another would, for its part, lead to a dramatic deterioration of the linearity of the produced gradient fields as well as to a strong reduction in the gradient strength per unit current.

It is therefore the underlying purpose of the invention to improve an NMR measuring device with a gradient coil system of the above-mentioned kind in such a fashion that x- and y-gradients can be simultaneously produced and that the tesseral gradient coils on the one hand produce as linear a magnetic gradient field as possible in the measuring volume, on the other hand, however, only marginally limit or do not limit whatsoever a sideward or diagonal access to the measuring volume and thereby open up a maximum free access to the measuring volume.

SUMMARY OF THE INVENTION

This purpose is accomplished in accordance with the invention in that each coil pair exhibits a plurality of windings and the two azimuthal segments exhibit an axial separation from one another in the direction of the z-axis whereby the radially outer segment, with the radial separation $r_2$ from the z-axis is arranged, relative to the z-axis, axially closer to the coordinate origin than the radially inner segment with the radial separation $r_1$ from the z-axis, and whereby the two segments are connected to each other via conducting sections and are located on a common rotationally symmetric or ellipsoidal surface $r(z)$.

With a configuration of this type, as will be shown further below, a tesseral gradient field can be produced whose linearity in the measuring volume is comparable to that of tesseral gradient fields produced by classical saddle coils or streamline-shaped coils, whereby the sideward access to the measuring volume, with the gradient coil system in accordance with the invention, is not hindered and with the additional advantage that an extremely small parasitic fraction of radial field components of the produced gradient field occur outside of the measuring volume. Due to the arrangement of all conducting elements of, for example, an x-gradient coil on a rotationally symmetric surface $r_x(z)$ it is possible for all partial coils of this gradient coil to be mounted, for example, on the outer surface of a closely neighboring mounting surface $r_{xl}(z)$. The surfaces of all parts of the completely mounted x-gradient coils then present a new and similarly closely neighboring surface upon which the partial coils of the y-gradient coils—each displaced 90° with respect to the corresponding partial coils of the x-gradient coils—can be placed and secured. It can be shown using field calculations that the coil system in accordance with the invention leads to quite satisfactory imaging performance.

The coils in accordance with the invention should also, for reasons of linearity, exhibit an azimuthal extent of circa 120°. However, the x- and y-gradient coils do not mutually disturb each other if, which is easily possible with the configuration according to the invention, all elements of, for example, the x-coil are located on a rotationally symmetric surface $r_x(z)$. The x-coil can be mounted with the surface of this coil likewise forming a nearly identical rotationally symmetric surface $r(z)$ upon which the elements of the y-coil—displaced by 90° with respect to the elements of the x-coils—can be mounted.

Although, in FIG. 9 of the above-cited publication DE 40 29 477 A1 a coil system is shown with which the radially separated azimuthal segments of a winding also exhibit an axial separation from another in the direction of the z-axis, in this gradient coil system coil windings are provided for at the center of symmetry, i.e. in the z=0 plane which would strongly limit or even prevent sideward access to the measuring volume in the xy-plane. Even if one were to omit, in the known gradient coil system, the middle windings in the xy-plane so that a sideward access gap were freed, the remaining partial coils would still be tilted relative to the z-axis in the "oppositely directed sense" as is the case with the gradient coil system according to the invention, namely the radially outer segment with the larger radial separation from the z-axis would be axially more distant from the coordinate origin than the radially inner segment with the reduced radial separation from the z-axis. Thereby a relatively non-linear gradient dependence would occur in the investigation volume. The known configuration thereby actually teaches away from the system in accordance with the invention.

In a particularly preferred embodiment of the invention the main field magnet which is principally formed from the main field coil exhibits a room temperature bore with a diameter $d_B$ as well as a gap g in the axial direction about the coordinate origin, whereby: $1.6\ g \leq d_B \leq 2.1\ g$. In this fashion the space in the axial bore of the main field magnet is optimally used by the gradient coil system.

In a further embodiment the axial separation $g_g$ in the z-direction of two partial coils lying mirror-symmetrically across from each other relative to the xy-plane is approximately equal to the gap g. In this fashion, on the one hand, the width of the gap is not further reduced and on the other hand, the gradient strength per unit current as well as the linearity of the gradient field remains maximized.

In a further preferred embodiment two times the radial separation $2\ r_2$ of the azimuthal segments lying closest to the gap is only slightly less than the diameter $d_B$ of the room temperature bore of the cryostat or of the main field magnet. In this fashion the space in the axial bore of the main field magnet is optimally utilized and, in particular, the gradient strength per unit current as well as the linearity of the gradient fields is maximized.

In a further preferred embodiment the value of the radial separation $2\ r_1$ of the azimuthal segments lying closest to the axis is only slightly larger than the diameter of a hypothetical cylinder allowing the patient sufficient room during the investigation.

In a further embodiment the radially outer segments lie on a surface of a cylinder with radius $r_2$ and the radially inner segments lie on a coaxial cylinder surface of radius $r_1$. In this fashion the production of the partial coils in accordance with the invention is simplified while, on the one hand, their outer contours are the same as those of the conventional cylindrical axial bore of the main field magnet and, on the other hand, the inner contours are optimally matched to the normally cylindrical patient bore.

In an alterative embodiment the segments can however lie on a conic surface opening up from the coordinate origin. Particularly advantageous for the manufacture of partial coils is an embodiment with which the outer and the inner segments each lie on the same conic surface.

In a further embodiment a compensating coil is provided for each partial coil which exhibits, in the axial region of the radially inner segment of the partial coil, an azimuthal inner segment with a radial separation $r_1'$ from the z-axis which is slightly different than the radial separation $r_1$ of the radially inner segment of the partial coil, preferentially by approximately the radial thickness of the segment. Such a compensation coil can at least partially compensate for the torque occurring when the current flows through the partial coils.

In a particularly advantageous improvement the compensation coil exhibits a second azimuthal segment which is further separated axially in the z-direction from the coordinate origin than the first azimuthal segment of the compensation coil and which has a radial separation $r_2' > r_1'$ from the z-axis. Such a compensation coil represents a second "cropped" saddle coil, which, with current flowing through it, together with the partial coil, generates a total field whose radial field contribution in the vicinity of the main field magnet coil and of the cryostat that usually surrounds it which is vanishingly small. In this fashion only minimal eddy currents, which could disturb the homogeneity of the magnetic field in the measurement volume of the main coil, are excited in the metal structures.

The partial coil and the compensation coil can exhibit very similar geometries in particular $r'_2 \approx r_2$ should hold, and preferentially $r'_2 = r_2$.

The maximum axial extents in the direction of the z-axis of the partial coil and the associated compensation coil can also be approximately equal.

In embodiments of the invention, however, the partial coil and the accompanying compensation coil can differ with respect to their number of windings.

An embodiment is particularly preferred with which shielding coils are provided, arranged around two partial coils each, which are situated axially opposite to each other with respect to the z-axis on the surface of a cylinder about the z-axis with a radius $R_2 \geq r_2$ and an axial extent in the z-direction which approximately corresponds to the axial extent of the main field magnet excluding the gap. With a shielding coil of this type, the radial field components of the gradient field in the region of the main field magnet, which are already small with the inventive coil shape and which, in principle, cause interfering eddy currents, can be further suppressed.

The windings of such a shielding coil are preferentially connected in series with the windings of the corresponding gradient coil.

Since, by itself, the gradient coil in accordance with the invention only produces small radial field contributions in the vicinity of the main field magnet, the number of windings of such a shielding coil is smaller than the number of windings of the corresponding gradient coil. Methods for calculating the optimal geometric dependence of the windings of such shielding coils can be derived from methods used in the case of conventional gradient coils arranged on a single cylinder surface, as given for example in the publication EP-A-0 216 590.

The coils in accordance with the invention can, in embodiments, comprise windings from wires, preferentially copper wires. In other embodiments the coils can, at least partially, be formed from closed band so-called "stream-line-coils", preferentially made from copper sheet metal. This type of stream-line-coil is known per se from the publication EP-A 0 320 285 and exhibits the advantages described therein.

An embodiment of the NMR measuring device in accordance with the invention is particularly preferred in which two sets of x- and y gradient coils are provided for which are displaced with respect to each other about the z-axis by 90° with each of which comprising four partial coils. In this fashion the advantageous relatively small azimuthal circumference about the z-axis of less than 90° of the inventive configuration of partial coils is appropriately made use of.

In order to be able to produce gradient fields in every spatial direction, in a preferred embodiment, a shielded z-gradient coil system for the production of magnetic gradient fields with largely linear dependences within the measurement volume in a direction parallel to the z-axis is provided for which is comprised of two cylindrical winding pairs arranged mirror-symmetrically with respect to the xy-plane about the z-axis each of which having a radially inner z gradient field winding and a radially outer shielding coil winding.

In order to optimally utilize the space left free between the radially outer segments and the patient bore in the gradient coil according to the invention, in a particularly preferred improvement of the above embodiment, the toroidal winding pairs are arranged in the axial region of the azimuthal segments, whereby the radial separation $r_4$ of the shielding coil winding is smaller than the radial separation $r_2$ of the radially outer segment.

The z-gradient field winding, in a preferred embodiment, exhibits approximately $(r_4/r_3)^2$ times the windings of the shielding coil windings surrounding it and running in the opposite direction, whereby $r_3$ is the radial separation of the z-gradient field winding from the z-axis. In this fashion the stray field in the vicinity of the cryostat can be substantially reduced. In general the number of windings of the shielding coil winding can be optimized in such a fashion that the stray field in the vicinity of the cryostat is minimal. In contrast to an "ideal" shielding, the windings of the shielding coil winding are not distributed, rather are arranged in a concentrated fashion. In this manner, the eddy current disturbances are nevertheless significantly smaller than with a non-actively shielded coil.

Both the gradient coil according to the invention, as well as the compensation, shielding, and cylindrical coils are usually potted with plastic in a support body in such a fashion, that an axial bore about the z-axis which is suitable to accept a person into the tomography system remains open.

In the NMR measuring device according to the invention, an RF-coil system can be provided for which is insertable axially into the axial bore of the support body or transversely into the gap g of the main field magnet and which produces a largely homogeneous RF-field in the direction of the x- or y-axis.

An embodiment is particularly preferred in which the RF-coil system comprises a saddle-shaped closed RF-coil which is arranged about the z-axis symmetrically to the zy-plane and to the xy-plane, however, asymmetrically with respect to the zx-plane.

Such a so-called "YIN-YANG-coil" allows, on the one hand for the production of sufficiently homogeneous RF-fields perpendicular to the z-axis and, on the other hand, does not hinder a sidewards access to the measuring volume.

In a preferred embodiment, the RF-coil exhibits four extreme value points $P_1$ through $P_4$ in the direction of the y-axis having the approximate, preferentially, exact coordinates:

| | | | |
|---|---|---|---|
| $P_1$: | $x_1 = 0$ | $y_1 = +a$ | $z_1 = +a$ |
| $P_2$: | $x_2 = 0$ | $y_2 = +a$ | $z_2 = -a$ |
| $P_3$: | $x_3 = -a$ | $y_3 = -a$ | $z_3 = 0$ |
| $P_4$: | $x_4 = +a$ | $y_4 = -a$ | $z_4 = 0$ | whereby a always indicates the same particular path length.

The path length can assume a value between 20 and 50 cm, preferentially approximately 30 cm.

The RF-coil in the NMR measuring device in accordance with the invention, can comprise wires, preferentially copper wires, from one or several windings. It can, however, in another embodiment, also be a conductive band made from a closed streamline coil, preferentially made from copper sheet metal.

The YIN-YANG coil is particularly simple to produce if it largely follows the contours of a cylinder about the z-axis of radius a. The coil can then be fashioned in a straight-forward fashion on a cylindrical winding body of this kind. Furthermore, it is simpler to mount an RF-coil with a cylindrical outer contour into the usually cylindrical room-temperature bore of an NMR cryostat than would be the case with a different outer contour shape.

In order to take full advantage of a larger transparency with respect to sideward access or an access from diagonally above in the direction of the measurement volume as achieved in the design of the gradient coil system in accordance with the invention, it is recommendable to utilize, as a main field coil, a system in accordance with the above-mentioned publication DE 39 07 928 A1 with a Helmholtz-like construction for the transverse field coil. The features and advantages of a main field coil of this type are discussed in detail in the mentioned publication, the entire contents of which are hereby incorporated by reference. A repetition of these features is unnecessary at this point.

The invention is described and explained in greater detail below in association with the drawing and the represented embodiments. The features which can be derived from the description and the drawing can be applied to other embodiments of the invention either individually or collectively in arbitrary combination.

BRIEF DESCRIPTION OF THE DRAWING

FIG. 8 shows a horizontal cut containing the xz plane through the gradient coil system in accordance with the invention;

DESCRIPTION OF THE PREFERRED EMBODIMENT

Figure 1:
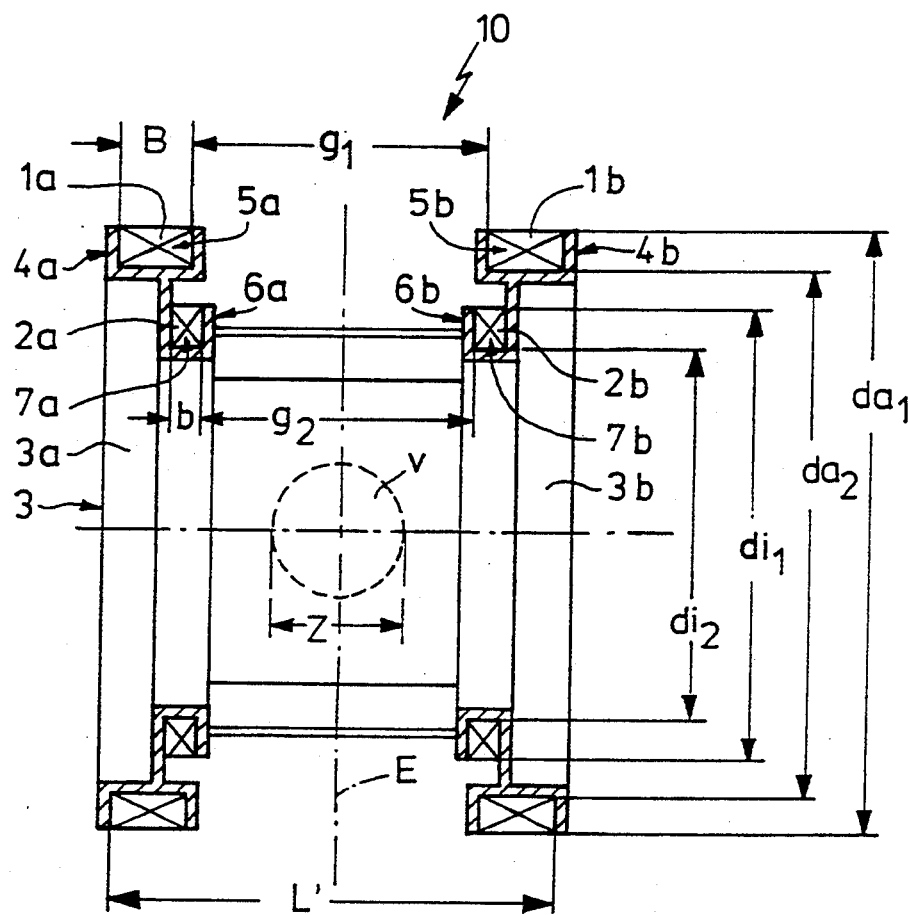
FIG. 1 shows a simplified schematic cross sectional view of a main field magnet system with the possibility of transverse access according to prior art in a radial plane containing the central longitudinal axis of the magnet system.

The main field coil system 10 shown in FIG. 1 includes an outer pair of windings or field coils 1a and 1b as well as an inner pair of windings or field coils 2a and 2b which run coaxially along a common central axis and, relative to a central transverse plane E which runs perpendicularly to the central axis, are, generally, symmetrically arranged. The outer windings 1a and 1b as well as the inner windings 2a and 2b are wound upon a coil body labelled in its entirety with 3, which includes two support rings 3a and 3b carrying the outer and inner windings 1a and 2a or 1b and 2b, respectively, each of which are arranged on one side of the transverse central plane E. These support rings 3a and 3b of the coil body 3 each have an outer rectangular adjacent U-shaped bracket 4a or 4b, which is open towards the outside in accordance with the representation of FIG. 1 and through whose axially directed clearance width B and radially directed depth $(d_{a1}-d_{a2})/2$ the rectangular cross sectional area of the winding chambers 5a and 5b, respectively, which is occupied by the windings of the outer field coil 1a or 1b in their most densely possible packing, is defined, whereby $d_{a1}$ designates the outer diameter and $d_{a2}$ the inner diameter of the outer windings 1a or 1b.

Furthermore, the support rings 3a and 3b each have an inner mutually adjacent rectangular U-shaped bracket 6a or 6b which likewise opens towards the outside in accordance with the representation of FIG. 1 through the axial clearance width b and the radially measured depth $(d_{i1}-d_{i2})/2$ of which the—likewise rectangular—cross sectional area of winding chambers 7a or 7b, which is taken up by the windings of the inner field coils 2a or 2b in their most densely possible packing, is defined, whereby $d_{i1}$ indicates the outer diameter and $d_{i2}$ the inner diameter of the inner windings 2a or 2b. The support rings 3a and 3b of both partial coil pairs are advantageously fashioned from separate partial rings $3a_1$ and $3a_2$ or $3b_1$ and $3b_2$, respectively, for the acceptance of one winding 1a and 2a or 1b and 2b, respectively, each. After winding the windings each partial ring is integrated with a support ring 3a or 3b and they are securely attached to each other. The support rings 3a and 3b thereby formed are, for their part, rigidly attached to another by means of longitudinal struts 8 whereby, which is not shown specifically, the axial separation of the support rings 3a and 3b can be adjusted. In the preferred embodiment shown in FIG. 2 the coil body 3 includes three such longitudinal struts which are arranged symmetrically to the longitudinal midplane containing the central axis of the magnet system 10 which is indicated in the plane of the drawing and thereby, as seen along the perpendicular axis, can be grouped axially symmetrically about the axis at equal angular intervals. The axial forces which are mutually exercised by the windings 1a and 1b as well as 2a and 2b on each other in the current carrying state of the magnet system are contained by the struts 8. The axial separation $g_1$ from another with which the outer windings 1a and 1b are arranged, can vary in the magnet system 10 between ¼ and ¾ of the inner coil diameter $d_{a2}$ of the outer field coil $1a$ or $1b$, whereby a preferred value of the separation $g_1$ is approximately half of this inner coil diameter $d_{a2}$.

The axial separation $g_1$ from another with which the two windings $1a$ and $1b$ of the outer coil pair are arranged, can assume a value between ¼ and ¾ of the inner diameter $d_{a2}$ of the outer coil pair $1a$, $1b$ and, in a special configuration of this coil pair, is approximately, e.g. within a deviation of ±10%, half as large as the inner coil diameter $d_{a2}$. Thereby the centers of gravity of the cross sections of the windings $1a$ and $1b$ (axially $(g_1+B)/2$, radially $(d_{a1}+d_{a2})/2$) are axially further apart than in a Helmholtz configuration of this winding pair.

The inner coil pair $2a$, $2b$ is, with regard to its characteristic dimensioning with outer diameter $d_{i1}$ and inner diameter $d_{i2}$, smaller than the outer coil pair $1a$, $1b$, whereby the magnitude of its winding density is equal to that of the outer coil pair. If necessary, the winding density can be chosen to be different.

The axial separation $g_2$ of the inner windings $2a$ and $2b$ is, within a deviation of at most 15%, equal to the axial separation $g_1$ of the outer windings $1a$, $1b$ and in the special embodiment shown is slightly smaller than the axial separation $g_1$ of the outer windings $1a$ and $1b$ so that the axial clearance between both windings $2a$ and $2b$ is similar to that between both outer windings $1a$ and $1b$.

The current flowing during operation of the magnetic system 10 through the inner pair of windings $2a$, $2b$ exhibits a direction which is opposite to that flowing through the outer pair $1a$ and $1b$ so that the magnetic fields produced by the two winding pairs $1a$, $1b$ and $2a$, $2b$ are oriented oppositely to another, whereby the number of windings of the outer windings $1a$ and $1b$ exhibits, under the assumption that equal currents flow through windings $1a$ and $1b$ as well as $2a$, $2b$, a ratio of approximately 4/1 to the number of windings in the inner windings $2a$ and $2b$, whereby this ratio can vary within a margin of approximately ±20%.

Through a judicious choice of the strength of the currents which flow through both winding pairs $1a$, $1b$ as well as $2a$, $2b$, it is possible to produce a static magnetic field which is sufficiently homogeneous within the investigation volume V, indicated by dashed lines in FIG. 1 as the circularly shaped bordered region with diameter Z, whereby this diameter Z assumes a value of approximately 40 cm (field deviation 20 ppm).

In a preferred configuration of the magnet system 10, involving superconducting magnet coils, the axial separation $g_1$ of the outer winding pair $1a$, $1b$ assumes a value of 887 mm and the axial width B of the winding chamber 220 mm. The axial extent L' of the magnet system 10 between the outer walls of the winding chambers $5a$ and $5b$ assumes a value of 1327 mm. The inner diameter $d_{a2}$ of the outer winding chambers $5a$ and $5b$ is 1818 mm and the outer diameter $d_{a1}$ of the outer windings $1a$ and $1b$ 1997 mm. The winding density in the outer winding chambers $5a$ and $5b$ assumes a value of 18.40 windings/cm².

With the inner winding pair $2a$, $2b$, the axial separation of its winding chambers $7a$, $7b$ is 881.5 mm, whereby the axial width b of these winding chambers $7a$ and $7b$ are 39.2 mm each. The inner diameter $d_{i2}$ of the windings $2a$ and $2b$ has a value of 1400 mm, while the outer diameter $d_{i1}$ of the inner windings $2a$ and $2b$ has a value of 1507 mm. The winding density of the inner windings $2a$ and $2b$ is opposite to that of the outer windings $1a$, $1b$ and has the value −46.73. With the cited separation $g_2$ of the winding chambers $7a$ and $7b$ of the inner coil pair $2a$ and $2b$, it is possible to construct a superconducting cryomagnet system with a usable intermediate volume z of 660 mm and a room temperature bore with a diameter of 1250 mm for the acceptance of gradient coils according to the invention.

With a current strength of 157 A a homogeneous magnetic field in the center of the magnet system 10 of 0.5 tesla results.

The gradient coil system which is preferably used in conjunction with this main field magnet includes by way of example a y transverse gradient coil, having an axial separation $g_g$ in the z direction between the two partial coils lying opposite each other mirror-symmetrically to the xy-plane of 680 mm. The radius $r_2$ of the azimuthal segment closest to the gap assumes a value of 600 mm. The partial coil has 27 rectangular cross sectional (5.93×10 mm²) copper wire windings which are edgewise wound so that the azimuthal segments have an axial extent of 160 mm. The other azimuthal segment of these partial coils has a radius $r_1$ of 350 mm and a separation between the xy plane and the winding lying closest to this plane of 540 mm. Both azimuthal segments are connected to each other by means of conducting sections which run largely radially at an axial separation of 520 mm from the xy plane. The central member of the 27 windings exhibits an azimuthal extent in each azimuthal segment of 120°.

The coil contains similarly constructed compensation coils with radii $r_1=360$ mm and $r_2=600$ mm with likewise 27 windings with, in the azimuthal segments, the middle ones of which exhibiting separations from the xy-plane of 620 mm or 820 mm. The conducting elements connecting both azimuthal segments are arranged largely in a radial direction in a plane parallel to the xy plane having a separation from the xy-plane of 720 mm. With a current strength of 250 A these y-gradient coils produce a homogeneous gradient field with a gradient strength of 14.25 milli tesla/m.

With this dimensioning of the y-gradient coil and similar dimensioning for the x-gradient coil, it is possible to achieve an axially free access for the patient, in the gradient system, of approximately 660 mm in diameter as well as a transverse access of 660 mm in width. The good linearity of the tesseral gradient coils is illustrated by the image of a quadratic pattern in the xy-plane shown in FIG. 12.

Figure 2:
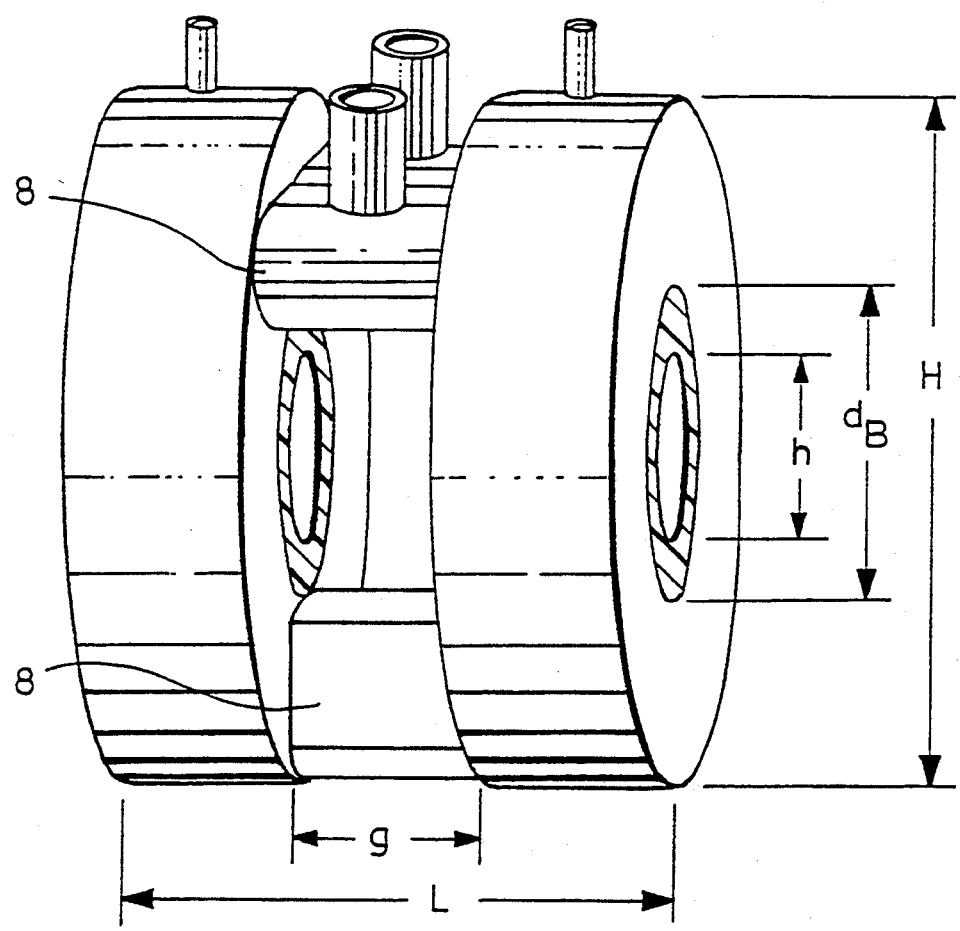
FIG. 2 shows an overall perspective view of the NMR-measuring apparatus in accordance with the invention with the accompanying cryostat for a superconducting main field magnet coil.

The overall perspective view of an embodiment of the NMR measuring device in accordance with the invention of FIG. 2 shows, among other things, the total height H of the apparatus, which is determined by the outer dimensions of the cryostat, the height h of the horizontal patient bore, the width g of the sideward access gap to the central investigational volume, and the length L of the entire apparatus.

Details of the superconducting main field magnetic coil cryosystem, likewise represented in FIG. 2, will not be further described.

Figure 3:
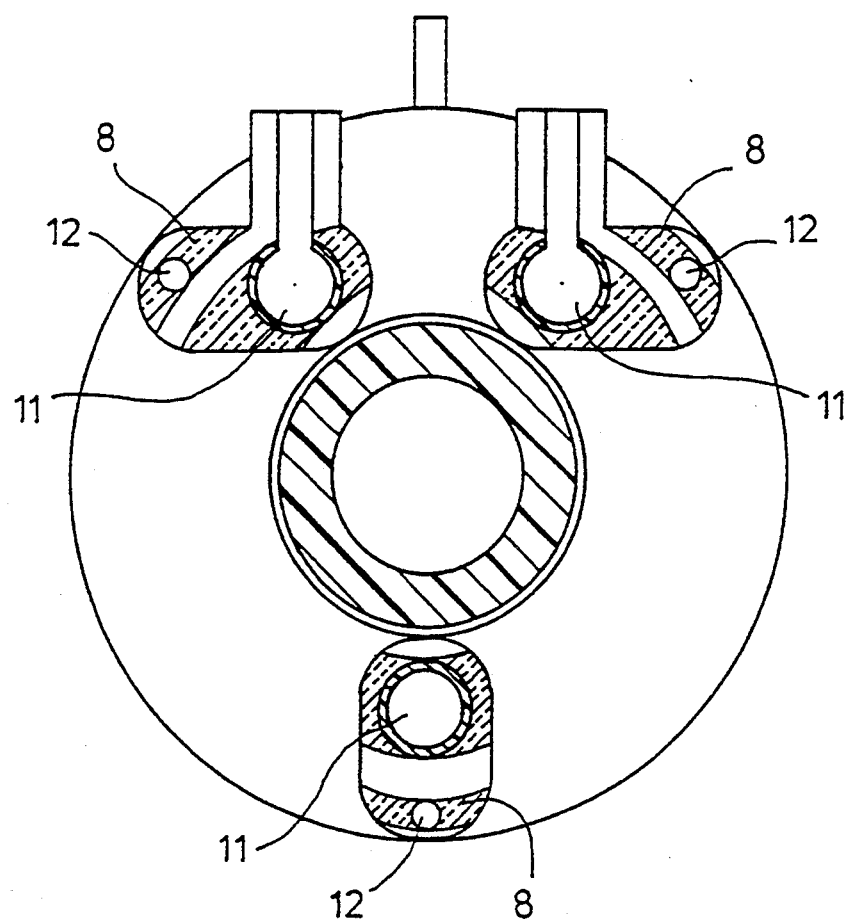
FIG. 3 shows a cut through the sideward access gap of the system represented in FIG. 2 with view of the patient bore of one of the two main coil halves.

FIG. 3 shows a cut perpendicular to the central axis through the sideward access gap of the NMR measuring device. Visible through the cut-open longitudinal strut 8 are connecting pipes 11 between the two sides of the helium tank of the cryosystem containing the superconducting magnet coil as well as connecting pipes 12 between the liquid nitrogen tanks surrounding the helium tanks. The normally present radiation shields are not illustrated.

Figure 4:
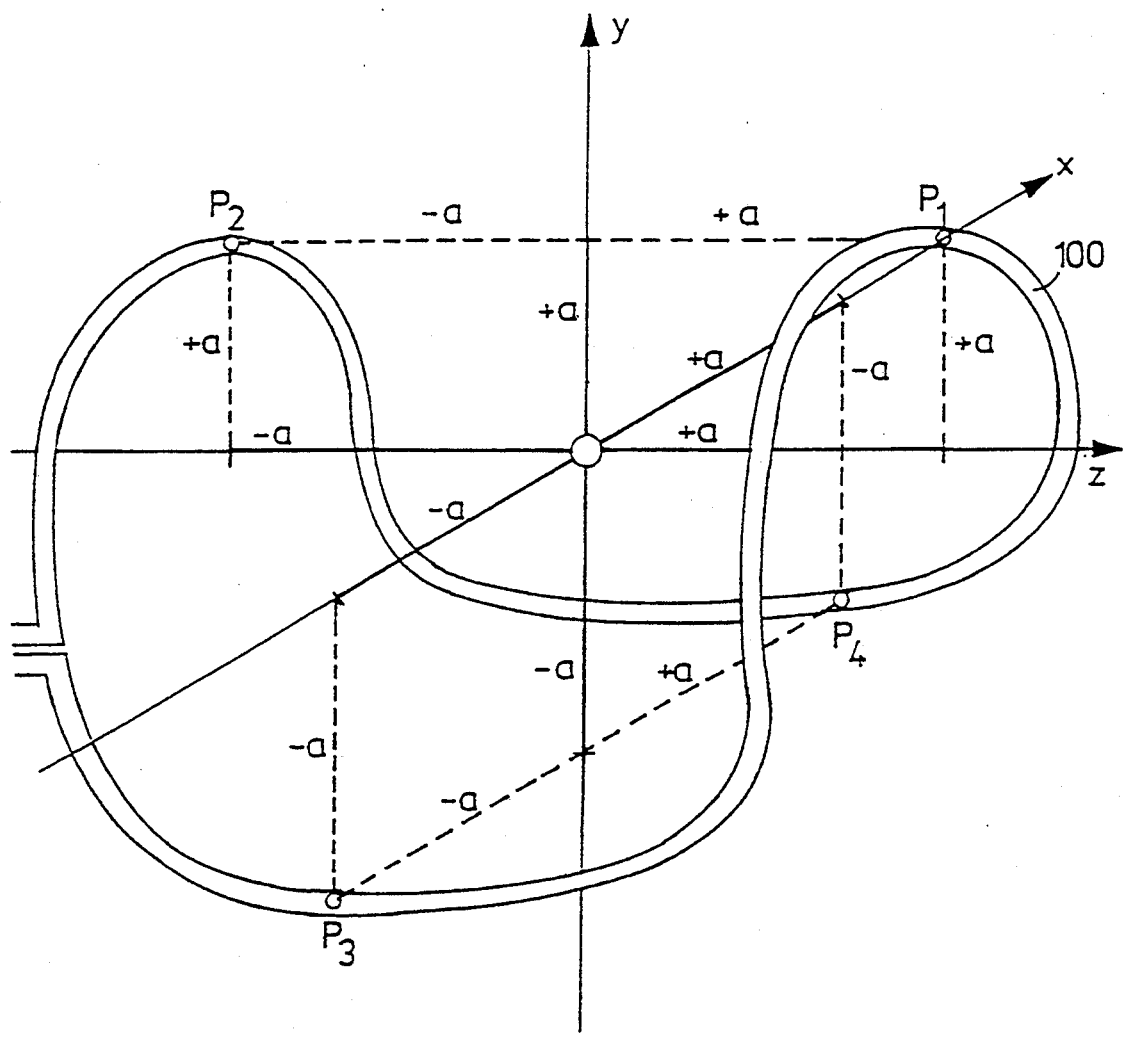
FIG. 4 shows a YIN-YANG coil spanning the coordinate origin at the center of the measurement volume of a Cartesian coordinate system.

The YIN-YANG-RF coil 100 shown in FIG. 4 which is preferentially used in the NMR system according to the invention is closed (with the exception of the current leads), saddle-shaped about the z-axis of a Cartesian coordinate system which coincides with the central axis of the main field magnet 10, and arranged symmetrically to the zy-plane and to the xy-plane, however, asymmetrically to the zx-plane. After installation into the NMR measuring device the coil surrounds the measurement volume arranged in the vicinity of the coordinate origin.

The YIN-YANG coil 100, as is visible in FIG. 4, permits a particularly good transverse access to a patient lying longitudinally along the z-axis in the homogeneous volume. Since no interfering transverse struts are provided for parallel to the z-axis above the zx-plane, the YIN-YANG-RF coil has a particularly large transparence.

Preferentially the four extreme value points $P_1$ through $P_4$ in the FIG. 4 representation of the RF-coil are located approximately at the following coordinates:

| | | | |
|---|---|---|---|
| $P_1$: | $x_1 = 0$ | $y_1 = +a$ | $z_1 = +a$ |
| $P_2$: | $x_2 = 0$ | $y_2 = +a$ | $z_2 = -a$ |
| $P_3$: | $x_3 = -a$ | $y_3 = -a$ | $z_3 = 0$ |
| $P_4$: | $x_4 = +a$ | $y_4 = -a$ | $z_4 = 0$ |

Thereby the path length a is between 20 cm and 50 cm, preferentially approximately 30 cm.

Figure 5A:
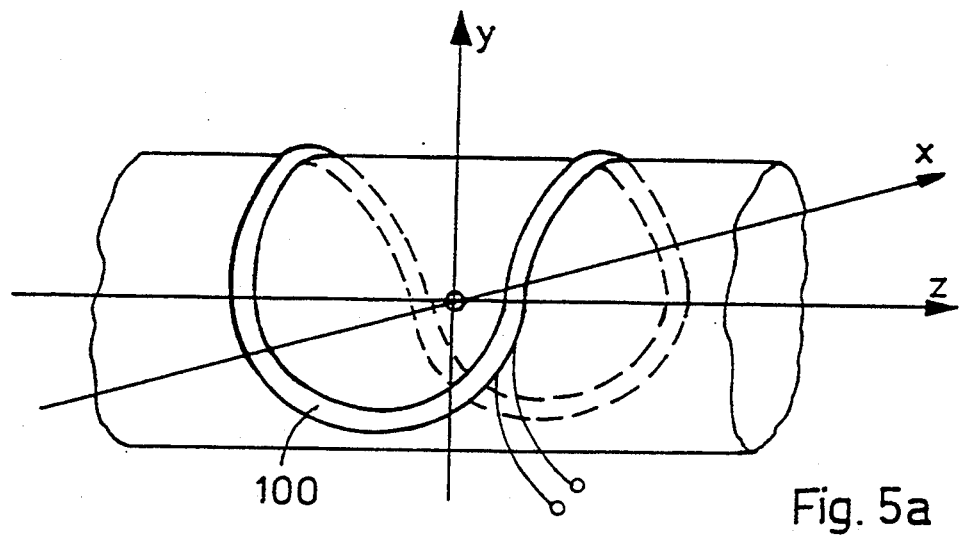
FIG. 5a shows a YIN-YANG coil which largely follows the contour of a cylinder.

The YIN-YANG-RF coil 100 can either, as shown in FIG. 4, exhibit rectangular contours with rounded edges or, however, as shown in FIG. 5a, can largely follow the contours of a cylinder about the z-axis with radius a. Such a cylinder would correspond fairly accurately to the room temperature bore of an NMR cryostat through which the patient is introduced into the NMR tomograph in the direction of the z-axis.

Figure 5B:
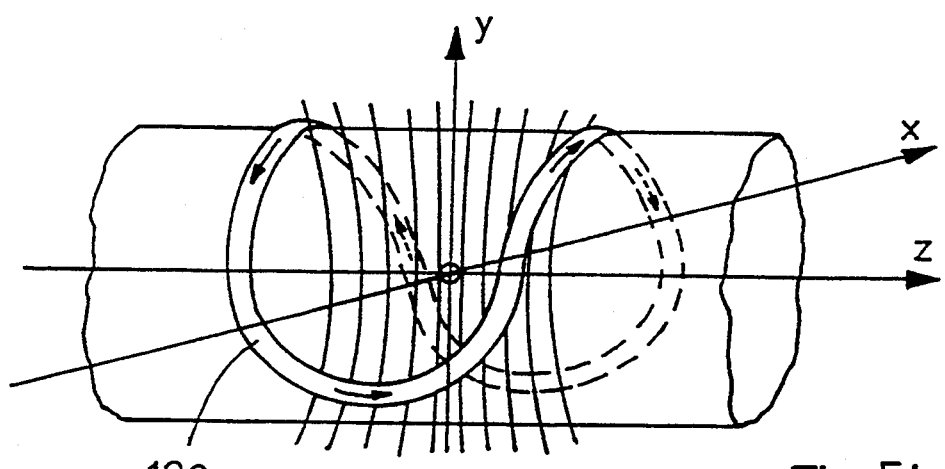
FIG. 5b shows a YIN-YANG coil with indicated RF-field lines.

The arrow shown on the coil 100 in FIG. 5b is intended to represent a possible current flow direction through the coil. Furthermore the RF field lines produced by the YIN-YANG RF coil 100 are suggested in FIG. 5b which run, in the measurement volume, about the coordinate origin in a largely homogeneous manner.

The YIN-YANG coil 100 can either be comprised of wires, preferentially copper wires, with one or more windings. Another possibility is the utilization of a closed electrically conducting band, preferentially made from copper sheet metal for the production of the YIN-YANG-RF coil 100 in the manner of the so-called "stream-line coil".

Figure 6:
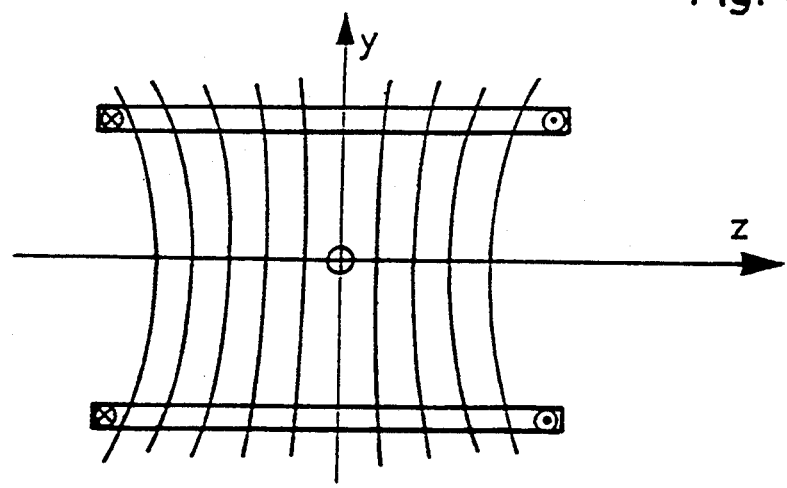
FIG. 6 shows a longitudinal cut through a Helmholtz-like RF-transmitting coil according to prior art.

For comparison, FIG. 6 shows a Helmholtz-like RF coil according to prior art which is comprised of two partial coils above and below the zx-plane, symmetric to the coordinate origin. In addition the RF-field line dependences associated with these known coils are shown. As clearly seen a transverse access is possible with this known arrangement, however, the upper partial coil limits, in any event, operator access diagonally from above.

Figure 7:
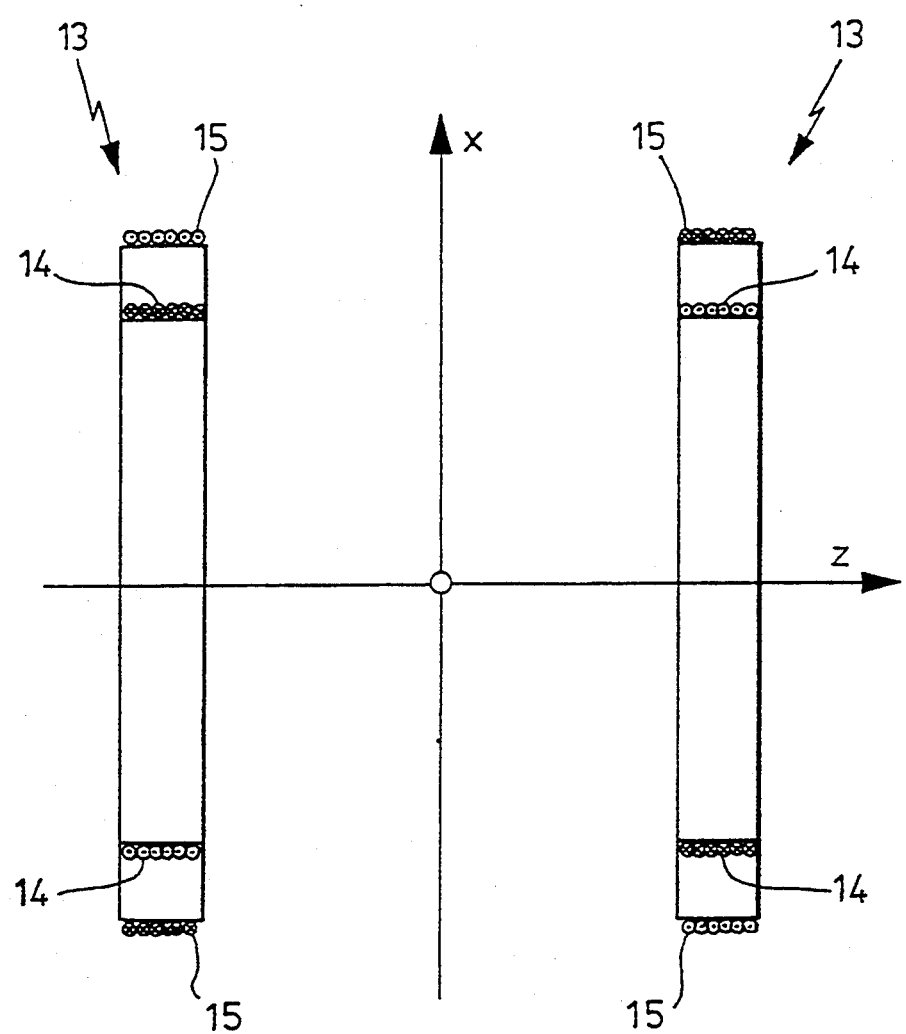
FIG. 7 shows a horizontal cut through a "nearly" shielded z-gradient coil.

For the production of a gradient field in the direction of the z-axis the shielded z-gradient coil system 13, shown in a cross sectional view in FIG. 7, is proposed. The partial coil systems which are arranged symmetrically with respect to the xy-plane are wound in opposite directions, whereby the radially inner z-gradient field winding 14, for its part, is wound opposite to the corresponding radial outward shielding coil winding 15. Preferentially the z-gradient field windings 14 exhibit more windings than the shielding coil windings 15 by the factor $(r_4/r_3)^2$.

FIG. 8 shows a cut in the xz-plane through the gradient coil system according to the invention in the axial bore of the main field magnet. The system shown includes four partial coils 20, which are arranged symmetrically to the coordinate origin. Together, the four partial coils 20 in FIG. 8 produce, within the investigational volume surrounding the coordinate origin, a largely constant gradient of the axial magnetic field component in the direction of the x-axis. Not illustrated in the drawing is a y-gradient system which is rotated by 90° about the z-axis with respect to the illustrated x-gradient system but which otherwise exhibits the same construction as the illustrated x-gradient system.

Figure 9A:
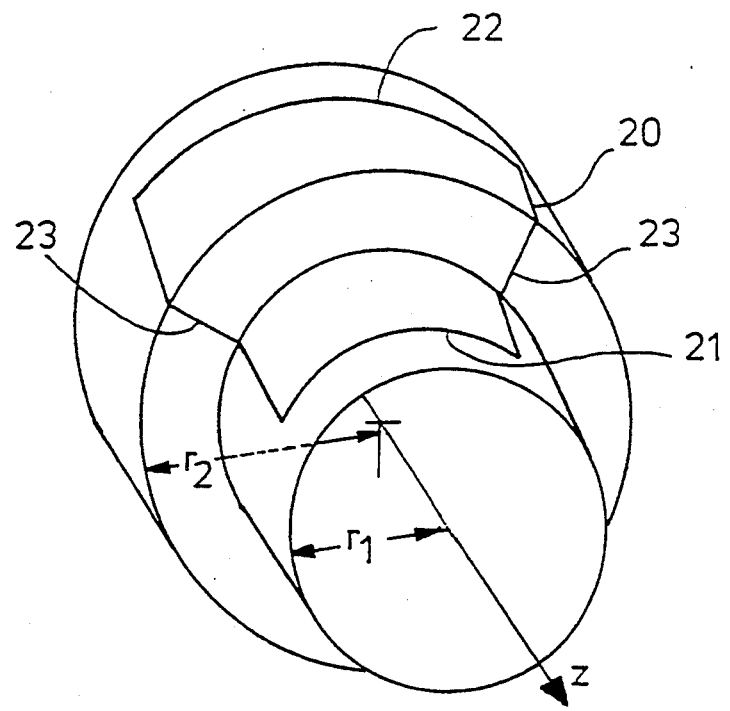
FIG. 9a shows a perspective view of "cropped" saddle coils according to the invention as partial coils of a gradient coil system with wire windings.
Figure 9B:
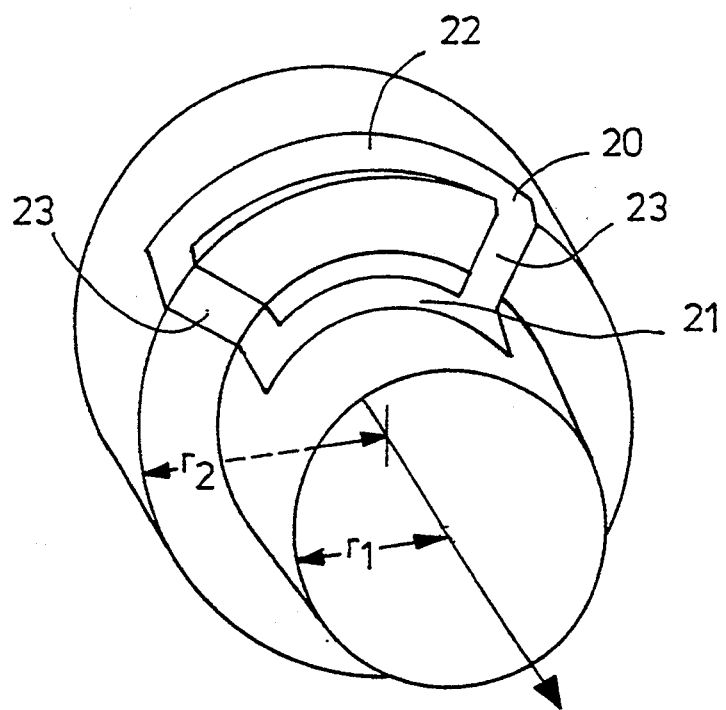
FIG. 9b shows a perspective view of "cropped" saddle coils according to the invention as partial coils of a gradient coil system with band-shaped construction.

The partial coils 20 of the tesseral gradient system are configured in a saddle-like fashion as can be seen in FIG. 9a and 9b. The individual partial coils 20 each exhibit, running in the azimuthal direction about the z-axis, two electrically conducting segments 21, 22 of which the radially inner segment 21 exhibits a separation $r_1$ and the radially outer segment 22 a separation $r_2$ from the z-axis. Both segments 21, 22 are axially separated from the z-axis, whereby the radially outer segment 22 is arranged more closely to the coordinate origin than the radially inner segment 21. Both segments, 21, 22 are connected to each other via conducting sections 23.

As shown in FIG. 9a, the partial coils 20 can be constructed from wires, preferentially copper wires or, as shown in FIG. 9b, from electrically conducting bands. A further possibility is that the partial coils 20 be constructed in the manner of stream-line coils.

In the embodiments shown in FIGS. 9a and 9b, the segments 21, 22 of the partial coils 20 lie on a surface of a cylinder about the z-axis. In embodiments not shown it is, however, possible for the segments to be located on conical surfaces which open towards the origin of the coordinate system.

In order to compensate for the torque caused by the passage of current through the partial coils 20, compensation coils 30, as shown in FIG. 8, are provided for which are largely similar in their construction to the partial coils 20. In particular the compensation coils 30 also exhibit azimuthally inner segments 31 and azimuthally outer segments 32 which have a larger radial separation from the z-axis than the inner segments 31.

In the embodiment shown, the compensation coil 30 is arranged as seen from the z-axis with its azimuthally inner segment 31 radially outside the radially inner segment 21 of the partial coil 20. In the direction of the z-axis, the two segments 21, 31 cover each other in the axial direction. The winding sense of the radially inner 21, 31 and radially outer 22, 32 segments are the same in each case. The number of windings of the compensation coil 30 is less than that of the partial coil 20, whereas the axial extent of both coils in the direction of the z-axis is the same.

As can be seen from FIG. 8 a shielding coil 40 is wound about the z-axis around two partial coils 20 each, which lie axially across from each other with respect to the z-axis, the shielding coil 40 having a radius $R_2$ which is larger than the radial separation $r_2$ of the outer segment 22 from the z-axis. The axial extent of the shielding coil 40 relative to the z-axis corresponds to the smallest axial separation of the partial coil 20 and the largest axial separation of the compensation coil 30 from the coordinate origin. In other words, the shielding coil 40 completely covers, axially, the combination of partial coil 20 and compensation coil 30. The shielding coil 40 serves for the suppression of the remaining radial components of the magnetic field produced by the coil combination 20, 30.

Finally, FIG. 8 again shows the shielded z-gradient coil system 13 of FIG. 7 with the radially inner z-gradient field winding 14 and the radially outer shielding coil winding 15. It is arranged in a space saving fashion, relative to the z-axis, radially within the radially outer segment 22 of the partial coil 20.

All gradient compensation and shielding coils 14, 15, 20, 30, 40 are potted with plastic in a support body in such a fashion that an axial bore about the z-axis, with a diameter d, which is suitable for the acceptance of a person in the NMR tomography system according to the invention, remains open.

Figure 10:
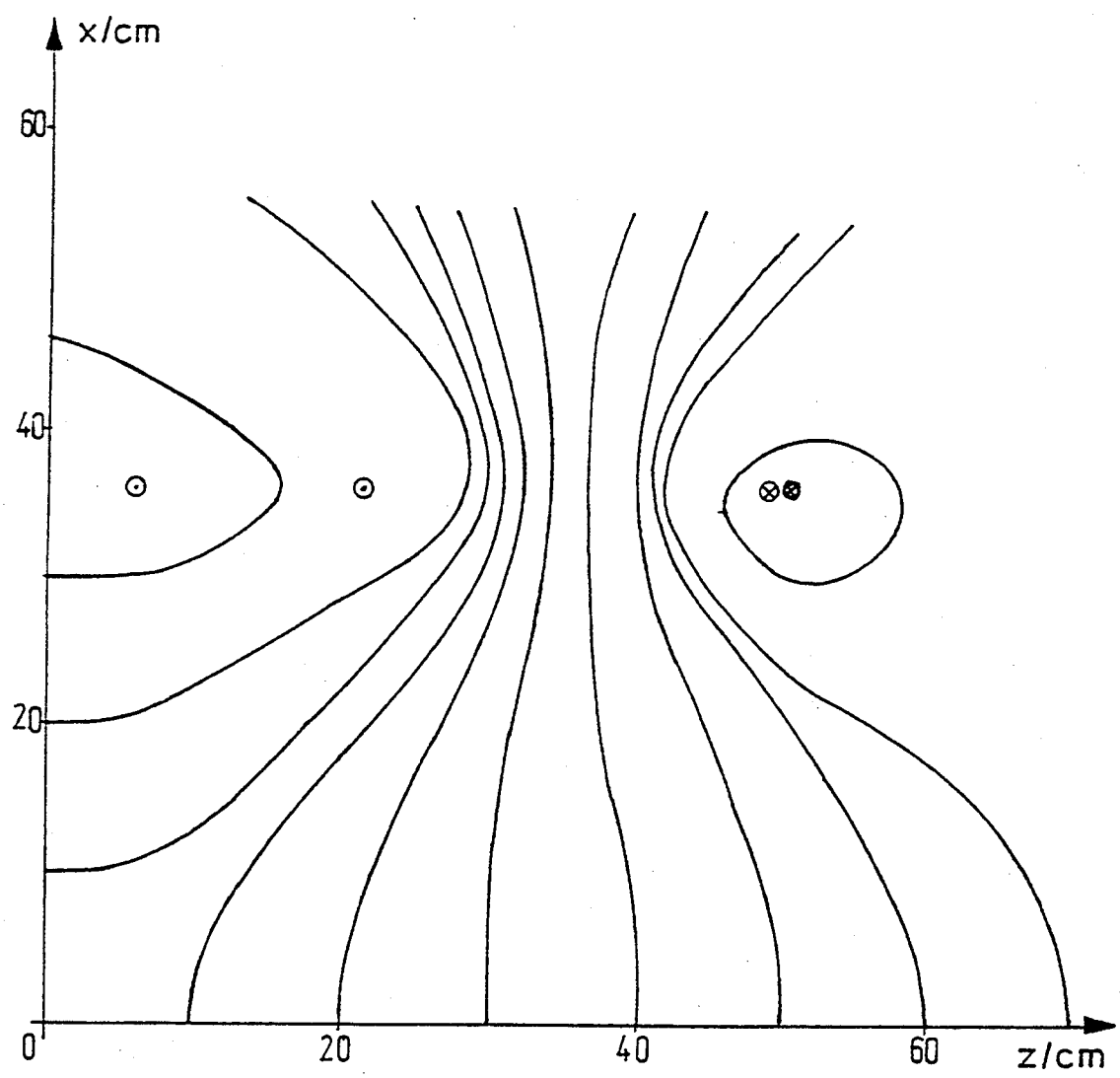
FIG. 10 shows the field distribution of a classic asymmetric saddle coil in the xz-plane.
Figure 11:
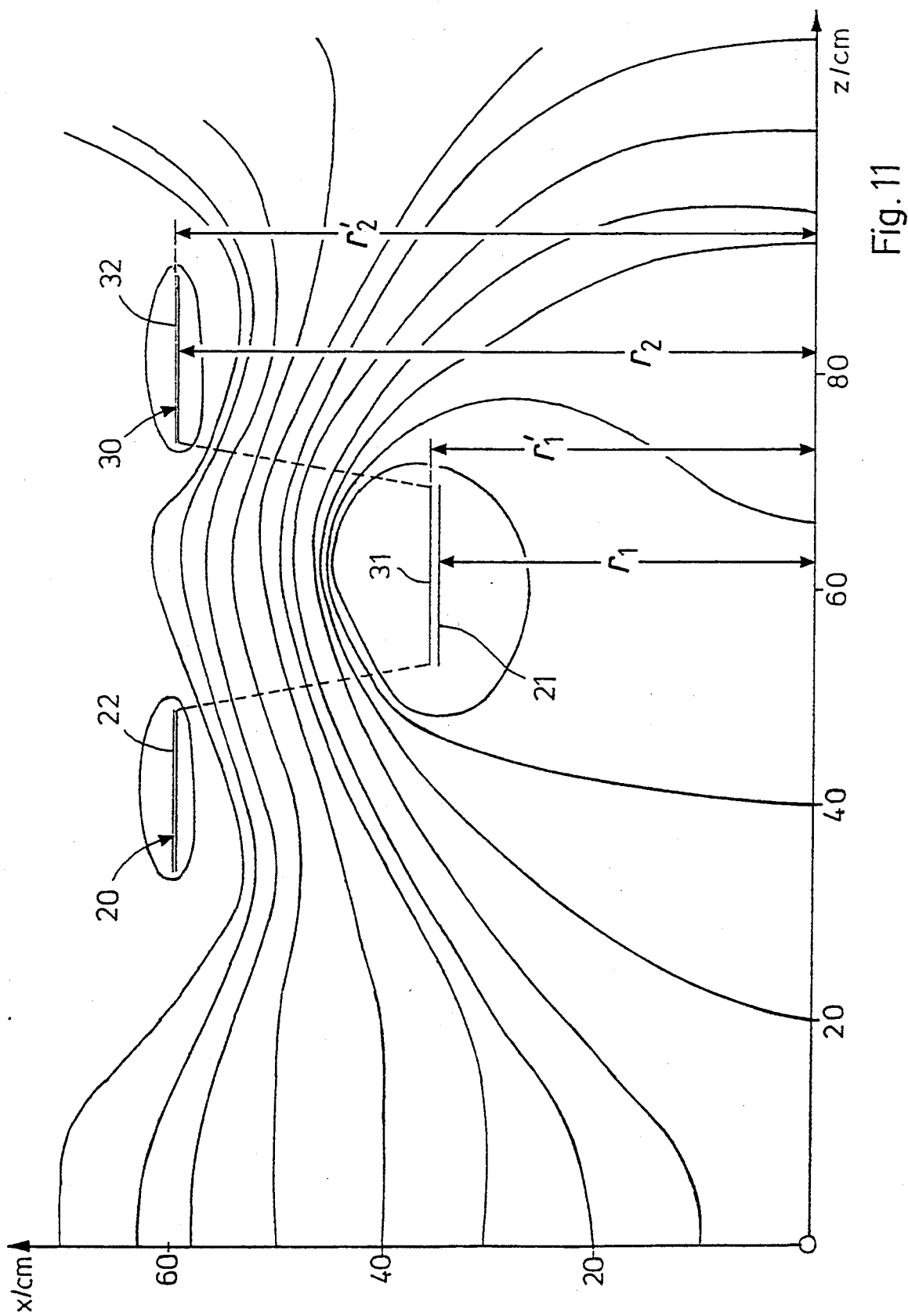
FIG. 11 shows the field distribution of a "cropped" saddle coil according to the invention in the xz-plane.

The FIGS. 10 and 11 show calculated field line dependences in the xz-plane. FIG. 10 shows the calculated field line dependence for a classical asymmetric saddle coil whereby the separated segments are shown on the left side and the more closely spaced return segments of the saddle coil are indicated on the right side. As one sees, at $z=0$, a partially linear gradient field dependence obtains whereas at $z \approx =38$ cm strong field lines occur which run radially outwards from the z-axis parallel to the x-axis and which could lead to strong eddy currents in the surrounding metal parts, in particular in the outer skin of the cryostat vessel. Furthermore, FIG. 10 again clearly shows that the classically asymmetrical saddle coil comes quite close to the xy-plane and thereby penetrates into the sideward access gap in an extremely interfering fashion.

A calculated field line distribution in the xz-plane of the combination of a "cropped" partial coil 20 in accordance with the invention and an associated compensation coil 30 is shown in FIG. 11. The radial separations from the z-axis of the partial coil radially inward segments 21 of $r_1$, the partial coil radially outer segments 22 of $r_2$, the compensation coil inner segment 31 of $r_1'$ and the compensation coil outer azimuthal segment of $r_2'$ are indicated in the figure. As can be seen at $z=0$ a linear gradient field distribution results which is similar to that shown by the classical asymmetric saddle coil in FIG. 10. It is, however, clearly seen that a sideward access along an axial length from the origin up to coordinate $z=34$ cm is possible without hindrance. Furthermore the coil combination 20, 30 produces nearly no destructive radial field components. The remaining parasitic radial portions of the produced gradient field can be easily compensated for by means of the shielding coil 40, something which was not considered in the calculation providing the basis for FIG. 11.

As clearly shown in FIG. 11, the radially outward segments 22 which lie most closely to the coordinate origin produce the main contributions to the field in the investigation volume. In order to achieve high gradient strengths with good linearity in the measuring volume, it is important that these radially outer segments 22 have as large a radial separation $r_2$ from the z-axis as possible.

Figure 12:
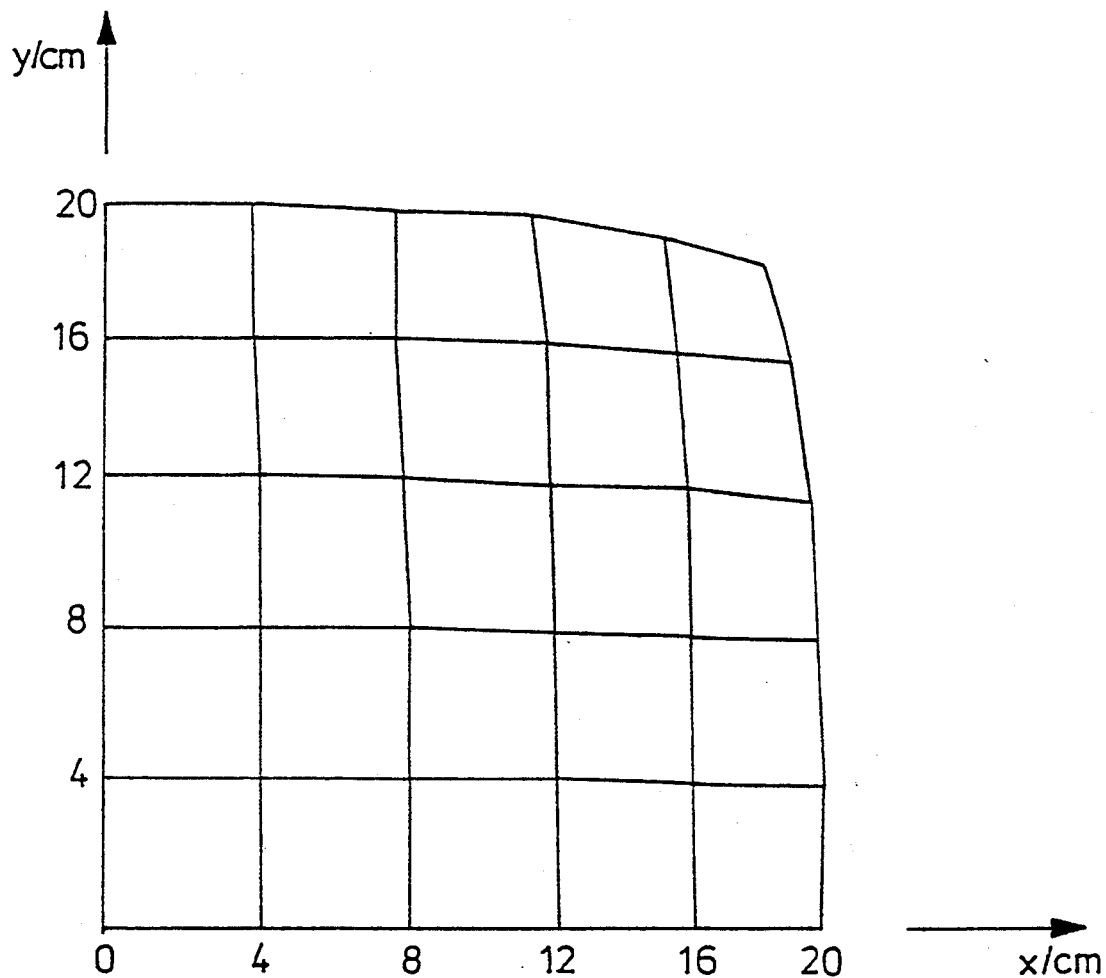
FIG. 12 shows the calculated imaging dependence of the gradient system according to the invention in the xy-plane.

Finally FIG. 12 shows the imaging performance of an x-gradient coil according to the invention in the xy-plane. As one sees the distortions of the represented quadratic grid network first occur at relatively large separations from the coordinate origin.

Due to the uninhibited sideward access to the investigational volume, the NMR tomography system in accordance with the invention described above allows completely new working modes for physicians in the diagnostic as well as surgical areas.

We claim:

1. A nuclear spin resonance (NMR) measuring device comprising:

a main field magnet, having a main field coil with a gap g, the main field magnet, in a measuring volume having a center coinciding with a coordinate origin of a Cartesian x, y, z coordinate system, producing a homogeneous static magnetic field $B_0$ in the direction of the z-axis of the coordinate system, and with a tesseral gradient coil system for the production, in a direction perpendicular to the z-axis within the measuring volume, of largely linear magnetic gradient fields, the gradient coil system comprising at least four largely identical saddle-like partial coils, having windings, which are arranged symmetrically, with radial and axial separations, from the coordinate origin, the partial coils each exhibiting a radially inner and a radially outer electrically conducting partial coil segment which extend in an azimuthal direction about the z-axis, the inner segment having a radial separation $r_1$ and the outer segment having a radial separation $r_2 > r_1$ from the z-axis, wherein each partial coil exhibits a plurality of windings, and both partial coil segments exhibit an axial separation from each other with the partial coil outer segment being axially closer to the coordinate origin than the partial coil inner segment and both partial coil segments being connected to each other via conducting sections and being located on a common surface r(z), the surface having one of a rotational and an ellipsoidal symmetry.

2. The NMR measuring device of claim 1, wherein the main field magnet exhibits a room temperature bore with a diameter $d_B$ and the gap g is in the axial direction about the coordinate origin, with $1.6 \, g \leq d_B \leq 2.1 \, g$.

3. The NMR measuring device of claim 2, wherein two partial coils are arranged opposite to each other, mirror-symmetrically to the xy-plane at an axial separation $g_g$ which is approximately equal to a width of the gap g.

4. The NMR measuring device of claim 2, wherein $2r_2$ is smaller than $d_B$.

5. The NMR measuring device of claim 1, wherein twice the value of the radial separation of the inner partial coil segment, $2r_1$ is only larger than the diameter of a hypothetical cylinder within which a patient can be positioned for an NMR tomography examination.

6. The NMR measuring device of claim 1, wherein the outer partial coil segment lies on a surface of a cylinder of radius $r_2$ and the inner partial coil segments on a cylinder surface of radius $r_1$ which is coaxial to the cylinder of radius $r_2$.

7. The NMR measuring device of claim 1, wherein for each partial coil, a compensation coil is provided which, in the axial vicinity of the inner partial coil segment exhibits an inner compensation coil segment having a radial separation $r_1'$ from the z-axis which deviates by approximately the radial thickness of the inner partial coil segment from the radial separation $r_1$ of the inner partial coil segment.

8. The NMR measuring device according to claim 7, wherein the compensation coil exhibits an outer compensation coil segment which is axially further away from the coordinate origin than the inner compensation coil segment and which has a radial separation $r_2' > r_1'$ from the z-axis.

9. The NMR measuring device of claim 8, wherein $r_2' \simeq r_2$.

10. The NMR measuring device of claim 7, wherein the compensation coil has a number of windings different than a number of windings of the partial coils.

11. The NMR measuring device of claim 7, wherein partial coils and the compensation coil have axial extents in the direction of the z-axis which are approximately the same.

12. The NMR measuring device of claim 7, wherein shielding coils, having windings, are provided for arranged about two partial coils each, the two partial coils lying axially across from each other with respect to the z-axis, the shielding coils being arranged on the surface of a cylinder about the z-axis with a radius $R_2 \geq r_2$ and having an axial extent in the z-direction which is approximately equal to the axial extent of the main field coil excluding the gap g.

13. The NMR measuring device of claim 12, wherein the shielding coil windings are connected in series with the windings of the corresponding partial coils.

14. The NMR measuring device of claim 12, wherein the number of windings of the shielding coils is less than the number of windings of the corresponding partial coils.

15. The NMR measuring device of claim 12, wherein at least one of the partial coils, the compensation coil, and the shielding coils comprise wire windings.

16. The NMR measuring device of claim 12, wherein at least one of the partial coils, the compensation coil and the shielding coils at least partially comprise stream-line coils made from closed bands.

17. The NMR measuring device of claim 1, wherein a set of x-gradient coils and a set of y-gradient coils are provided for, which are displaced relative to each other about the z-axis by 90°, and each set comprises four partial coils.

18. The NMR measuring device of claim 1, wherein a shielded z-gradient coil system is provided for the production of a magnetic gradient field with a largely linear dependence in the measuring volume in a direction parallel to the z-axis, the shielded z-gradient coil system comprising two cylindrical winding pairs which are arranged around the z-axis mirror-symmetrically to the xy-plane each of which having a radially inner z-gradient field winding and a radially outer z-gradient shielding coil winding.

19. The NMR measuring device of claim 18, wherein the cylindrical winding pairs are arranged in an axial region of the outer partial coil segment, and the z-gradient shielding coil winding exhibits a radial separation $r_4$ which is smaller than the radial separation $r_2$ of the radially outer partial coil segment.

20. The NMR measuring device of claim 18, wherein the inner z-gradient field winding exhibits a number of windings approximately equal to $(r_4/r_3)^2$ times a number of z-gradient shielding coil windings, with $r_3$ being the radial separation of the inner z-gradient field winding and $r_4$ the radial separation of the z-gradient shielding coil winding from the z-axis.

21. The NMR measuring device of claim 12, wherein at least one of the partial coils, the compensation coil, and the shielding coils are potted in plastic within a support body so that an axial bore about the z-axis remains open which is suitable for the acceptance of a person.

22. The NMR measuring device of claim 21, wherein axially in the axial bore of the support body or transverse in the gap g of the main field coil, an insertable radio frequency (RF) coil is provided for the production of a largely homogeneous RF field within the measuring volume in the direction of at least one of the x and the y axis.

23. The NMR measuring device of claim 22, wherein the RF coil comprises closed saddle shaped RF coils which are arranged about the z-axis symmetrically to the zy- and xy-planes, but asymmetrically to the zx-plane.

24. The NMR measuring device of claim 23, wherein the RF coil exhibits four extreme value points $P_1$ through $P_4$ in the direction of the y-axis with the approximate coordinates:

| $P_1$: | $x_1 = 0$ | $y_1 = +a$ | $z_1 = +a$ |
|---|---|---|---|
| $P_2$: | $x_2 = 0$ | $y_2 = +a$ | $z_2 = -a$ |
| $P_3$: | $x_3 = -a$ | $y_3 = -a$ | $z_3 = 0$ |
| $P_4$: | $x_4 = +a$ | $y_4 = -a$ | $z_4 = 0$ | with the variable a being a constant path length.

25. The NMR measuring device of claim 24, wherein the constant a assumes a value between 20 cm and 50 cm.

26. The NMR measuring device of claim 22, wherein the RF coil comprises at least one wire winding.

27. The NMR measuring device of claim 22, wherein the RF-coil is made from a closed conducting band.

28. The NMR measuring device of claim 22, wherein the RF-coil largely follows the contours of a cylinder about the z-axis.

29. The NMR measuring device of claim 1, wherein the main field magnet exhibits a pair of mutually identical main magnet outer coils which are arranged on a common axis with an axial separation $g_1$ from another as well as a pair of likewise mutually identical main magnet inner coils which are coaxial to the main magnet outer coils, with both coil pairs being arranged symmetrically to a central middle plane E running perpendicularly to the common axis and, during operation of the main field magnet, the direction of a current in the main magnet inner coils is opposite to that of a current in the main magnet outer coils, and the axial separation $g_1$ of the main magnet outer coils lies in the range of $\frac{1}{4}$ and $\frac{3}{4}$ of that of an inner diameter $d_{a2}$ of these coils and an axial separation $g_2$ of the main magnet inner coils is equal to, within a deviation of at most 15%, the axial separation $g_1$ so that an opening angle for a transverse access opening to the investigational volume is defined which runs transverse to the direction of the homogeneous magnetic field and between the main magnet inner coils.

* * * * *